United States Patent [19]

Fukiage

[11] Patent Number: 5,008,609
[45] Date of Patent: Apr. 16, 1991

[54] VOLTAGE GENERATING CIRCUIT FOR SEMICONDUCTOR DEVICE

[75] Inventor: Takahiko Fukiage, Hyogo, Japan

[73] Assignee: Mitsubishi Denki Kabushiki Kaisha, Tokyo, Japan

[21] Appl. No.: 526,740

[22] Filed: May 22, 1990

[30] Foreign Application Priority Data

Jun. 6, 1989 [JP] Japan .................. 1-144776

[51] Int. Cl.$^5$ ............................... G05F 3/20
[52] U.S. Cl. ..................... 323/313; 323/315; 307/296.6; 307/296.8
[58] Field of Search ............... 323/311, 312, 313, 314, 323/315, 316, 317; 307/303.2, 296.6, 296.7, 296.8

[56] References Cited

U.S. PATENT DOCUMENTS

| | | | |
|---|---|---|---|
| 3,683,270 | 8/1972 | Mattis | 323/317 |
| 3,942,128 | 3/1976 | Seki et al. | 323/311 |
| 4,346,344 | 8/1982 | Blauschild | 323/316 |
| 4,460,864 | 7/1984 | Ray | 307/296.6 |
| 4,628,248 | 12/1986 | Birrittella et al. | 323/316 |

FOREIGN PATENT DOCUMENTS 0022112 2/1984 Japan ................... 323/315

OTHER PUBLICATIONS

Reference Voltage Generator, Abilevitz et al., IBM Technical Disclosure Bulletin, vol. 20, No. 10, Mar. 76, pp. 3927-3929.

Primary Examiner—Peter S. Wong
Assistant Examiner—Nilay H. Vyas
Attorney, Agent, or Firm—Lowe, Price, LeBlanc, Becker & Shur

[57] ABSTRACT

In an output stage, an n-FET and a p-FET are connected in series, which is interposed between a power supply line and a ground. A first serial connection circuit generates a gate potential of the n-FET, and a second serial connection circuit generates a gate potential of the p-FET. The first and the second serial connection circuits are connected in parallel to each other, each of which has its one end connected to the power supply line through a resistor, and its other end connected to the ground through a resistor. As a result, even if a resistance value of the resistor is small, currents to be consumed can be reduced.

3 Claims, 1 Drawing Sheet

VOLTAGE GENERATING CIRCUIT FOR SEMICONDUCTOR DEVICE

BACKGROUND OF THE INVENTION

1. Field of the Invention

The present invention relates generally to voltage generating circuits for a semiconductor device, and more particularly, to an improvement of a circuit for generating a voltage to be applied to a predetermined part of a semiconductor device.

2. Description of the Background Art

In a semiconductor device such as a dynamic RAM, a voltage generating circuit is provided for generating a voltage to be applied to cell plates and bit lines.

FIG. 1 is a circuit diagram showing a voltage generating circuit for such a conventional semiconductor memory device, which is shown in U.S. Pat. No. 4,788,455. In the drawing, the voltage generating circuit comprises n-type field effect transistors 1–3, p-type field effect transistors 4–6, and resistors 7–10. Two serial connection circuits 31 and 32 are interposed in parallel between a power supply line 20 and a ground. The first serial connection circuit 31 comprises the resistor 7, the n-type field effect transistors (hereinafter referred to as n-FET) 1 and 2 and the resistor 8 connected in series. The resistor 7 has one end connected to the power supply line 20, and the other end connected to a drain electrode and a gate electrode of the n-FET 1. A source electrode of the n-FET 1 is connected to a drain electrode and a gate electrode of the n-FET 2. A source electrode of the n-FET 2 is connected to one end of the resistor 8. The other end of the resistor 8 is connected to the ground. On the other hand, the second serial connection circuit 32 comprises the resistor 9, the p-type field effect transistors (hereinafter, referred to as p-FET) 4 and 5, and the resistor 10 connected in series. The resistor 9 has one end connected to the power supply line 20, and the other end connected to a source electrode of the p-FET 4. A drain electrode of the p-FET 4 is connected to its gate electrode and a source electrode of the p-FET 5. A drain electrode of the p-FET 5 is connected to its gate electrode and one end of the resistor 10. The other end of the resistor 10 is connected to the ground. The n-FET 3 and p-FET 6 are connected in series to be interposed between the power supply line 20 and the ground. More specifically, the n-FET 3 has its drain electrode connected to the power supply line 20, and its source electrode connected to a source electrode of the n-FET 6. A drain electrode of the p-FET 6 is connected to the ground, while a gate electrode of the n-FET 3 is connected to the drain electrode of the n-FET 1, and a gate electrode of the p-FET 6 is connected to the drain electrode of the p-FET 5. An output $V_{out}$ is taken from a node between the source electrode of the n-FET 3 and the source electrode of the p-FET 6.

Now, operation of the voltage generating circuit shown in FIG. 1 will be described. When a power supply is turned on, a power supply voltage $V_{CC}$ is applied to the power supply line 20, so that n-FETs 1 and 2 are rendered conductive, and the p-FETs 4 and 5 also rendered conductive. Now, assuming that a resistance value R7 of the resistor 7 and a resistance value R8 of the resistor 8 are equal (R7=R8), a potential at a node between the drain electrode of the n-FET 1 and the resistor 7, that is, a gate potential of the n-FET 3 becomes as represented by the following equation, $$(V_{CC}/2) + V_{thn}$$

while a potential at a node between the drain electrode of the p-FET 5 and the resistor 10, that is, a gate potential of the p-FET 6 is represented by the following equation, $$(V_{CC}/2) - V_{thp}$$

Accordingly, when the output voltage $V_{OUT}$ becomes larger than $V_{CC}/2$, the p-FET 6 is rendered conductive so that the output voltage $V_{OUT}$ drops. On the other hand, when the output voltage $V_{OUT}$ becomes smaller than $V_{CC}/2$, the n-FET 3 is rendered conductive, so that the output voltage $V_{OUT}$ rises. Accordingly, the output voltage $V_{OUT}$ is always held at $V_{CC}/2$.

More specifically, the voltage generating circuit of FIG. 1 is a voltage generating circuit for stably generating a voltage $V_{CC}/2$ which is half of the power supply voltage.

Since a conventional voltage generating circuit is constructed as the above, currents always flow through the first serial connection circuit 31 and the second serial connection circuit 32. Therefore, resistance values of the resistors 7–10 should be made larger in order to reduce power consumption. However, because the resistors 7–10 are formed by diffusion resistance in a semiconductor substrate, the area of the resistors is increased in proportion to the resistance values. As a result, a circuit area of a voltage generating circuit became larger. The resistors 7 and 8, and 9 and 10 form voltage dividing circuits for generating each gate potential of the n-FET 3 and p-FET 6, respectively. Therefore, if resistance values become larger, fluctuation of the power supply voltage $V_{CC}$ causes accuracy of detection of a reference voltage to be generated in each voltage dividing circuit to be rendered, so that the output voltage $V_{OUT}$ could not be held at $V_{CC}/2$.

SUMMARY OF THE INVENTION

The present invention is achieved for solving the above problems, and its object is to provide a voltage generating circuit having less power consumption and a small circuit area and providing a more stable output voltage.

A voltage generating circuit for a semiconductor memory device according to the present invention comprises a first serial connection circuit including a first resistance means, one or more first conductive-type field effect transistors, and a second resistance means connected in series, and a second serial connection circuit including a third resistance means, one or more second conductive-type field effect transistors, and a fourth resistance means connected in series. The first serial connection circuit and the second serial connection circuit are connected in parallel with each other, and each of the first and the second conductive-type field effect transistors has its gate connected to its first conductive electrode. In addition, a fifth resistance means is interposed between a first reference potential source and the first and the second resistance means, and a sixth resistance means is interposed between a second reference potential source and the second and the fourth resistance means. A first output terminal is connected to a first conductive electrode of any of the first conductive-type field effect transistors, and a second output terminal is connected to a first conductive electrode of any of the second conductive-type field effect transistors.

In the present invention, the first serial connection circuit and the second serial connection circuit are connected in parallel to each other, the fifth resistance means is interposed between the first reference potential source and the first and the second serial connection circuits, the sixth resistance means is interposed between the first and the second serial connection circuits and the second reference potential source, so as to reduce currents flowing through the first and the second serial connection circuits, thereby reducing resistance values of resistance means to be used, so that circuit area is reduced.

More specifically, according to the present invention, since even if resistance means of small resistance value are used, currents to be consumed can be reduced as compared with a conventional voltage generating circuit, circuit area can be reduced. In addition, even if a power supply voltage fluctuates, output voltages can be changed less widely since voltage values generated in each of serial connection circuits do not change widely.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
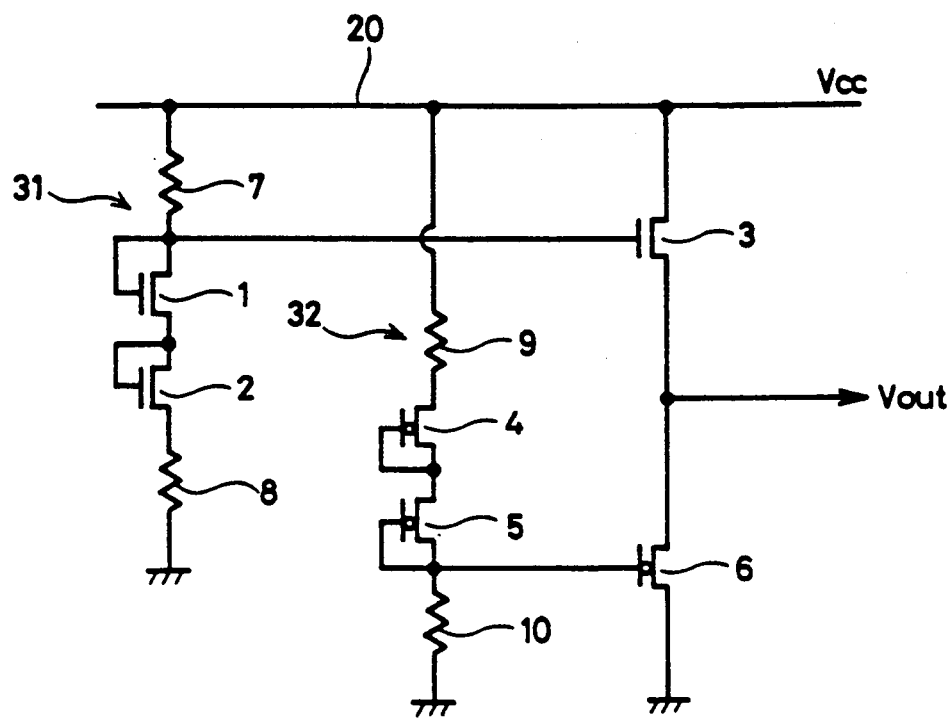
FIG. 1 is a circuit diagram showing a voltage generating circuit for a conventional semiconductor device.
Figure 2:
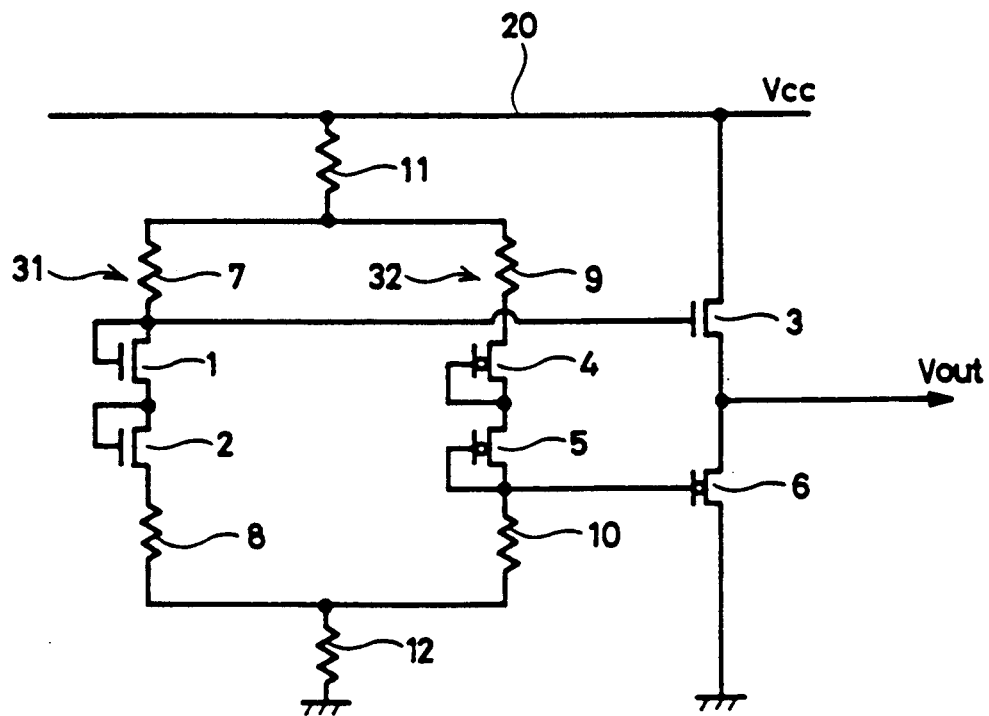
FIG. 2 is a circuit diagram showing one embodiment of the present invention.

FIG. 2 is a circuit diagram showing an embodiment of the present invention. In the drawing, in this embodiment, as well as a conventional circuit shown in FIG. 1, a first serial connection circuit 31, a second serial connection circuit 32, and an n-FET 3 and a p-FET 6 are provided. In addition, resistors 11 and 12 are provided. The first and the second serial connection circuits 31 and 32 are connected in parallel to each other, and the resistor 11 is interposed between one ends of the resistors 7 and 9 and a power supply line 20, while the resistor 12 is interposed between one ends of resistors 8 and 10 and a ground. The rest of the structure is the same as that of the conventional circuit shown in FIG. 1.

Operation of the above embodiment is almost the same as that of the conventional circuit shown in FIG. 1. The difference from the conventional circuit shown in FIG. 1 is that currents flowing through the resistor 11 are divided into the first and the second serial connection circuits 31 and 32 and then are merged to flow into the ground through the resistor 12.

Now, the embodiment of FIG. 2 and the conventional circuit shown in FIG. 1 will be compared. It is assumed that each resistance value of the resistors 7-10 of the conventional circuit shown in FIG. 1 is 400 kΩ, and each resistance value of the resistors 7-12 of the embodiment of FIG. 2 is 200 kΩ. In this case, in comparing currents to be consumed, consumed current of the first serial connection circuit 31 of the conventional circuit shown in FIG. 1 will be represented by the following equation, $$(V_{CC} - 2V_{thn})/(400 + 400) \quad (1)$$

while a consumed current of the second serial connection circuit 32 of the conventional circuit of FIG. 1 will be represented by the following equation.

$$(V_{CC} - 2V_{thp})/(400 + 400) \quad (2)$$

Accordingly, the consumed current of the conventional circuit of FIG. 1 is a sum of a value of the equation (1) and a value of the equation (2), so that if it is assumed that $V_{thn} = V_{thp} = V_{th'}$, the total value will be represented by the following equation.

$$(V_{CC} - 2V_{th})/400 \quad (3)$$

On the other hand, consumed current of the embodiment of FIG. 2 will be represented by the following equation.

$$(V_{CC} - 2V_{th})/600 \quad (4)$$

Now, when comparison is made between the consumed current of the conventional circuit of FIG. 1 represented by the equation (3) and the consumed current of the embodiment of FIG. 2 represented by the equation (4), it can be seen that the consumed current of the circuit of the embodiment shown in FIG. 2 is smaller.

Next, comparison will be made in resistance area. In the conventional circuit of FIG. 1, four resistors of 400 kΩ are used, while in the embodiment of FIG. 2, six resistors of 200 kΩ are used. Therefore, an area ratio of a resistance area in the embodiment of FIG. 2 to a resistance area of the conventional circuit of FIG. 1 will be represented by the following equation.

$$(200 - 6)/(400 - 4) = 0.75$$

More specifically, in the embodiment of FIG. 2, the resistance area is about 75% of that of the conventional circuit of FIG. 2.

Now, it will be described that in the embodiment of FIG. 2, the same effect can be obtained even if resistance values of the resistors 7-10 and the resistors 11 and 12 are changed. For example, in the embodiment of FIG. 2, assuming that resistance values of the resistors 7-10 are 20 kΩ, and resistance values of the resistors 11 and 12 are 400 kΩ, consumed current is represented by the following equation, $$(V_{CC} - 2V_{th})/820$$

and is smaller than the consumed current of the conventional circuit of FIG. 1 represented by the equation (3). In addition, regarding the ratio of resistance area, the resistance area of the embodiment of FIG. 2 is 55% of that of the conventional circuit of FIG. 1.

As described in the foregoing, the embodiment of FIG. 2 can reduce both of currents to be consumed and resistance area as compared with the conventional circuit of FIG. 1.

Although in the embodiment of FIG. 2, the resistors 7-12 are employed as resistance means, field effect transistors may be used. In addition, although in the embodiment of FIG. 2, two of the n-FETs 1 and 2, and two of the p-FETs 4 and 5 are provided, one or more than three of each n-FET and p-FET may be provided. In this case, a value of the output voltage $V_{OUT}$ is stabilized at a value other than $V_{CC}/2$. More specifically, the present invention is not limited to generation of an output voltage of $V_{CC}/2$, but may generate a voltage of other values.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage generating circuit for a semiconductor memory device, comprising:
    a first serial connection circuit including first resistance means, one or more first conductive-type field effect transistors, and second resistance means which are connected in series to each other, and
    a second serial connection circuit including third resistance means, one or more second conductive-type field effect transistors, and fourth resistance means which are connected in series to each other, said first and second serial connection circuits being connected in parallel, each of said first and second conductive-type field effect transistors having its gate connected to its first conductive electrode,
    fifth resistance means interposed between a first reference potential source and said first and third resistance means,
    sixth resistance means interposed between a second reference potential source and said second and fourth resistance means,
    a first output terminal connected to a first conductive electrode of any of said first conductive-type field effect transistors, and
    a second output terminal connected to a second conductive electrode of any of said second conductive-type field effect transistors.

2. A voltage generating circuit for a semiconductor device according to claim 1, wherein
    said first, second, third, fourth, fifth and sixth resistance means are resistance elements.

3. A voltage generating circuit for a semiconductor memory device according to claim 1, wherein,
    either one of said first and second reference potential sources is a power supply voltage supply line, and the other is a ground voltage supply line.

* * * * *